_United States Patent_ [19]

McNeilly et al.

[11] 4,081,313
[45] Mar. 28, 1978

[54] PROCESS FOR PREPARING SEMICONDUCTOR WAFERS WITH SUBSTANTIALLY NO CRYSTALLOGRAPHIC SLIP

[75] Inventors: Michael A. McNeilly; Walter C. Benzing, both of Saratoga; Richard M. Locke, Jr., Palo Alto, all of Calif.

[73] Assignee: Applied Materials, Inc., Santa Clara, Calif.

[21] Appl. No.: 739,293

[22] Filed: Nov. 5, 1976

Related U.S. Application Data

[60] Continuation of Ser. No. 543,878, Jan. 24, 1975, abandoned, which is a division of Ser. No. 310,444, Nov. 29, 1972, abandoned, which is a continuation-in-part of Ser. No. 195,505, Nov. 3, 1971, abandoned, which is a division of Ser. No. 866,473, Oct. 15, 1969, Pat. No. 3,623,712.

[51] Int. Cl.² .................. H01L 21/20; H01L 21/324
[52] U.S. Cl. .................... 156/610; 118/49.5; 148/1.5; 148/175; 156/612; 219/343; 427/55
[58] Field of Search ............... 148/1.5, 174, 175; 427/55; 156/610, 612; 219/343, 354, 377; 313/222; 118/49.5

[56] References Cited

U.S. PATENT DOCUMENTS

| 3,047,438 | 7/1962 | Marinace | 148/1.5 |
|---|---|---|---|
| 3,160,517 | 12/1964 | Jenkin | 118/49.5 X |
| 3,240,915 | 3/1966 | Carter et al. | 219/343 |
| 3,364,087 | 1/1968 | Soloman et al. | 118/49.5 X |
| 3,408,982 | 11/1968 | Capita | 118/49.5 |
| 3,424,628 | 1/1969 | Winnings | 148/175 |
| 3,460,510 | 8/1969 | Currin | 118/48 |
| 3,502,516 | 3/1970 | Henker | 148/175 |
| 3,627,590 | 12/1971 | Mammel | 148/175 X |
| 3,661,637 | 5/1972 | Sirtl | 148/175 X |
| 3,692,572 | 9/1972 | Strehlow | 148/175 X |

FOREIGN PATENT DOCUMENTS 938,699   10/1963   United Kingdom ............... 118/49.5

OTHER PUBLICATIONS

Powell, C. F., "Vapor Deposition" (Textbook) 1966, John Wiley & Sons Inc., N.Y., N.Y., pp. 263–267.

Primary Examiner—L. Dewayne Rutledge
Assistant Examiner—W. G. Saba
Attorney, Agent, or Firm—Flehr, Hohbach, Test, Albritton & Herbert

[57] ABSTRACT

Process and apparatus for heating substrates to form semiconductor regions. A gaseous reactant is introduced into a reaction chamber formed from a material, such as quartz, which is transparent and non-obstructive to radiant heat energy transmitted at a predetermined short wave length. A graphite susceptor, which is opaque to and absorbs the radiant heat energy, is positioned within the reaction chamber and supports the substrates to be processed. The susceptor and substrates are heated directly while the walls of the reaction chamber remain cool. The substrates are heated uniformly, and single crystal semiconductor wafers processed by this technique have little or no crystallographic slip. To further insure uniform heating, the susceptor may be moved relative to the radiant heat source which, in the preferred embodiment, comprises a bank of tungsten filament quartz-iodine high intensity lamps.

4 Claims, 9 Drawing Figures

PROCESS FOR PREPARING SEMICONDUCTOR WAFERS WITH SUBSTANTIALLY NO CRYSTALLOGRAPHIC SLIP

CROSS REFERENCE TO RELATED APPLICATIONS

This is a continuation of application Ser. No. 543,878, filed Jan. 24, 1975, now abandoned, which was a division of application Ser. No. 310,444, filed Nov. 29, 1972, now abandoned, which was a continuation-in-part of application Ser. No. 195,505, filed Nov. 3, 1971, now abandoned, which was a division of application Ser. No. 866,473, filed Oct. 15, 1969, now U.S. Pat. No. 3,623,712, issued Nov. 30, 1971.

BACKGROUND OF THE INVENTION

1. Field of the Invention

This invention relates to the field of manufacturing semiconductor wafers by techniques such as vapor deposition of films on substrates. More particularly, the field of this invention involves the vapor deposition of epitaxial films, for example single crystal films such as silicon films and amorphous films such as silicon dioxide films, on exposed surfaces of articles, such as single crystal silicon and non-crystalline wafer substrates commonly used in the electronics industry. Gaseous chemical reactants are brought into contact with a heated substrate within a reaction chamber the walls of which are transparent to radiant heat energy transmitted at a predetermined short wave length. A susceptor, which absorbs energy at the wavelength chosen, supports the substrate to be coated. In one preferred embodiment, the susceptor heats the substrate with energy absorbed from a radiant heat source. In other preferred embodiments, which are particularly suitable for use with single crystal substrates and/or films, both the susceptor and the substrate are heated directly and simultaneously by the absorption of heat energy transmitted into the reaction chamber from the radiant source.

2. Description of the Prior Art

While single crystal substrates, such as silicon wafers, and non-crystalline substrates have been coated heretofore with amorphous epitaxial films, such as silicon dioxide films, and with single crystal films, such as silicon films, so far as is known, the specific and improved vapor deposition procedure and apparatus disclosed herein are novel. The apparatus and process of this invention are effective to produce uniform film coatings on substrates under controlled conditions so that coated substrates with high quality and excellent film thickness uniformity are producible within closely controlled limits. Moreover, with single crystal substrates and/or films, little or no crystallographic slip is introduced into either the substrate or the film during processing.

In chemical deposition systems, it is highly desirable to carry out the deposition reaction in a cold wall type reaction chamber. By maintaining the reaction chamber walls in the unheated state, such walls receive little or no film deposition during substrate coating. Cold wall systems are additionally desirable because they permit the deposition of high purity films, such as silicon and silicon dioxide films. Impurities can be evolved from or permeate through heated reaction chamber walls. Because such impurities would interfere with and adversely affect the purity of the substrate coating, cold wall reaction chambers are employed to preclude such impurity evolution of permeation.

To avoid such problems, chemical deposition processes have been developed heretofore which permit heating of a substrate positioned within a reaction chamber without simultaneously heating the reaction chamber walls. Heretofore, the most successful of such processes involved the use of radio frequency (RF) induction heating of a conducting susceptor positioned within the reaction chamber, the walls of which were formed of non-conducting or insulating material. For example, RF heating of a graphite susceptor within a quartz reaction chamber for depositing epitaxial silicon films has been known generally heretofore. The RF energy used typically has a frequency on the order of 5 KHz to 500 KHz.

However, such an RF heating technique, while it generally produces the stated objective in a cold wall reaction chamber, has several inherent and important disadvantages which make the same undesirable under many circumstances. For example, an expensive and bulky RF generator is required which is very space consuming and which must be located close to the epitaxial reactor. Also, the high voltages required with the RF coils produce substantial personnel hazards, and RF radiation from the RF coils can and frequently does interfere with adjacent electrical equipment. Furthermore, such an RF procedure requires the utilization of an electrically conducting susceptor for supporting substrates to be heated. Also, RF systems are considered more expensive overall then the simplified radiation heated system disclosed herein which were designed to replace the RF system utilized heretofore.

RF systems and other indirect heating systems in which energy is induced in a susceptor which in turn transfers heat to the substrates have another important disadvantage. Less than perfect contact between the substrates and the susceptor causes localized heating of the substrates and therefore generates significant thermal gradients in the substrates. With substrates fabricated of a single crystal material, the stress induced by the thermal gradients frequently exceeds the elastic limit of the crystal and is relieved by movement of crystal planes relative to one another. This mode of stress relief results in a crystal defect known as crystallographic slip. Such slip can be generated at a steady state condition as well as during wafer heat-up. If heating of the single crystal wafer is indirect, i.e., by transfer from a heated susceptor, and heat transfer to the wafer or heat loss from the wafer is not uniform, significant temperature gradients may exist in a direction parallel to the wafer surface at steady state. These gradients may arise from temperature gradients in the susceptor, variations in the spacing of the wafer from the susceptor, wafer bow, and/or variations in heat loss from the wafer.

Crystallographic slip might, to some extent, be eliminated by maintaining perfect contact between the wafers and the susceptor, by heating the wafers very slowly, or by making the wafers thicker or smaller in diameter. However, these techniques are difficult to implement and practically impossible to utilize in a production environment.

SUMMARY OF THE INVENTION

The invention relates generally to an improved procedure for coating a substrate with an epitaxial film, an improved apparatus for effecting such procedure, and the improved coated wafer produced thereby. More particularly, this invention relates to a vapor deposition apparatus and process for depositing a film in epitaxial fashion on a substrate, such as on a silicon wafer commonly employed in the electronics industry in the manufacture of integrated circuits, transistors and the like. The film can be either a single crystal film, such as a silicon film, or an amorphous film such as an oxide, nitride, metal or other similar film. The substrate can be fabricated of either a single crystal, a poly-crystalline or a non-crystalline material. Still more particularly this invention relates to a cold wall epitaxial reactor and process for coating substrates without utilizing radio frequency induction heating of the type heretofore employed in cold wall vapor deposition system. Further, the invention pertains to a process and apparatus for heating single crystal substrates directly to produce wafers having little or no crystallographic slip.

In the subject procedure, a reacton zone, defined by an enclosed reaction chamber the walls of which are formed from a predetermined material specially selected for use in the reaction, has one or more substrates to be epitaxially coated positioned therein. In the preferred embodiments, a susceptor is utilized to support the substrates in the reaction chamber. A gaseous chemical mixture, composed of one or more suitable reactants, is introduced into the reaction chamber into contact with the heated substrates. The substrates are heated with radiant energy from a non-RF heat source without simultaneously heating the walls of the reaction chamber so that the substrates become coated with the epitaxial reactant material while the walls remain uncoated. In some embodiments, the substrates are heated by energy which the susceptor absorbs from the heat source, while in other embodiments both the susceptor and the substrates are heated directly with energy from the source.

Disadvantages inherent with prior known RF induction heated systems are overcome with the more compact radiation heated systems of this invention which transmits heat from a radiation heat source positioned outside the reaction chamber. The frequencies of the radiated heat energy and the material from which the reactor walls are formed are selected so that the radiant heat energy is transmitted at a wave length which passes through the walls of the reaction chamber without being absorbed by the same so that the walls remain cool and essentially unheated.

When the substrates to be coated are suitably heated by the radiant energy from the heat source, a gaseous reactant mixture is introduced into the reaction chamber into contact with the substrates to effect epitaxial coating thereof in known fashion. In that regard, any of the gaseous chemical reactants commonly used in epitaxial coating procedures may be employed with the present invention.

An improved heat source preferably employed with the present system comprises a high intensity, high temperature lamp which operates at a filament temperature in the range of 5000° to 6000° F., by way of example. The lamp actually chosen is selected from the type which produces radiant heat energy in the short wave length range, preferably approximately 1 micron or below. Radiant energy in such short wave lengths passes through materials found suitable for defining the walls of the reaction chamber, of which quartz is preferred. Quartz walls possess excellent radiant energy transmission characteristics at the wave length noted so that little or no radiation is absorbed by the walls, thus retaining the advantages of cool wall reaction system noted previously.

The substrates are heated uniformly, and in certain preferred embodiments there is little or no crystallographic slip in the wafers.

From the foregoing it should be understood that objects of this invention include the provision of an improved cold wall process for epitaxially coating a substrate with a film of a predetermined type; the provision of a gaseous desposition apparatus for vapor depositing an epitaxial film on a heated substrate; the provision of improved apparatus and process for epitaxially coating substrates by employing a radiant energy heat source which transmits heat energy in short wave lengths through the walls of a reaction chamber which are transparent and non-obstructive to such energy at the wave length chosen; the provision of an improved apparatus and method which utilizes an opaque susceptor on which substrates are supported and heated within a reaction chamber, the walls of which are defined by a material which is transparent to radiant heat energy while the susceptor is opaque to and absorbs such heat energy so that heating of this susceptor is effected; the provision of a process and apparatus in which both the susceptor and the substrates are heated directly with radiant energy to produce coated wafers having little or no crystallographic slip; and the provision in a radiation heated reactor of a heat source defined by one or more high intensity lamps which transmit radiant energy at a shortwave length which readily passes through without heating a reactor chamber wall.

These and other objects of this invention will become apparent from a study of the following description in which reference is direct to the attached drawings.

DESCRIPTION OF THE PREFERRED EMBODIMENTS

Several embodiments of apparatus designed to carry out the improved epitaxial deposition procedure of this invention are disclosed herein. Each of such embodiments employs the same basic concepts characteristics of the improved features of this invention, namely the utilization of a cold wall reaction chamber in which a substrate to be epitaxially coated is positioned, preferably upon a susceptor which is opaque and absorbs radiant heat energy transmitted through the walls of the reaction chamber without absorption by such walls. The source for such radiant heat comprises a high intensity lamp, or bank of such lamps, which produces and transmits high temperature heat energy at a wave length which is not interferred with by the walls of the reaction chamber.

The chemical epitaxial deposition procedure within the reaction chamber is essentially the same as that employed heretofore with known coating procedures. Therefore, only brief reference herein is directed to the concepts of epitaxial film growth which are well known and understood in the chemical vapor desposition art. By way of introductory example, however, the apparatus and process of this invention are utilizable to produce various epitaxial films on substrates, such as silicon wafers. The system of this invention employs chemical reaction and/or thermal pyrolysis to deposit a variety of films, including single crystal films such as silicon, germanium, Gallium arsenide and gallium arsenide phosphide films; noncrystalline films such as silicon nitride and silicon dioxide films; and metal films such as molybdenum, titanium, zirconium and aluminum films, in accordance with reactions such as the following:

Silicon epitaxial growth by silane or silicon tetrachloride pyrolysis at temperatures within the range of 900°–1200° C. occurs as follows:

$$SiH_4 \xrightarrow{Heat} Si + 2H_2$$

$$SiCl_4 + 2H_2 \rightarrow Si + 4HCl\ 4HCl$$

Silicon nitride deposition may be effected at temperatures in the range of 600° to 1100° C. in accordance with reaction such as the following:

$$3SiH_4 + 4MH_3 \rightarrow Si_3N_4 + 12 H_2$$

$$3SiCl_4 + 4MH_3 \rightarrow Si_3N_4 + 12 HCl$$

Deposition of silicon dioxide from silane or silicon tetrachloride may be effected in accordance with the following reaction at temperatures of 800° to 1100° C.:

$$SiH_4 + H_2 + 2CO_2 \rightarrow SiO_2 + 3H_2 + 2CO$$

$$SiCl_4 + 2H_2 + 2CO_2 \rightarrow SiO_2 + 4HCl + 2CO$$

At somewhat lower temperatures, silicon dioxide deposition from silane oxidation in the range of 300° to 500° C. may be effected as follows:

$$SiH_4 + O_2 \rightarrow SiO_2 + 2H_2$$

Also, metal deposition at temperatures in the range of 900° to 1200° C. can be produced in accordance with the following exemplary reaction:

$$2MoCl_5 + 5H_2 \rightarrow 2Mo + 10 HCl$$

Corresponding reactions for producing other exemplary metal and non-metal films as noted above also can be employed in accordance with known procedures. The above reactions are intended as examples of procedures for which a cold wall deposition system is highly effective, and alternative uses for such a system by those skilled in the chemical deposition art will become apparent from the following detailed description.

Apparatus of the type described herein has been effectively used for producing silicon, silicon nitride and silicon dioxide dielectric films with film thickness uniformity of ± 5% from wafer to wafer within a run. Highly effective results can be insured because operating temperatures can be closely controlled and uniformly held due to use of the novel heat source employed herewith. Wafers processed by the apparatus of FIGS. 6–9 have been found to have little or no crystallographic slip.

Figure 1:
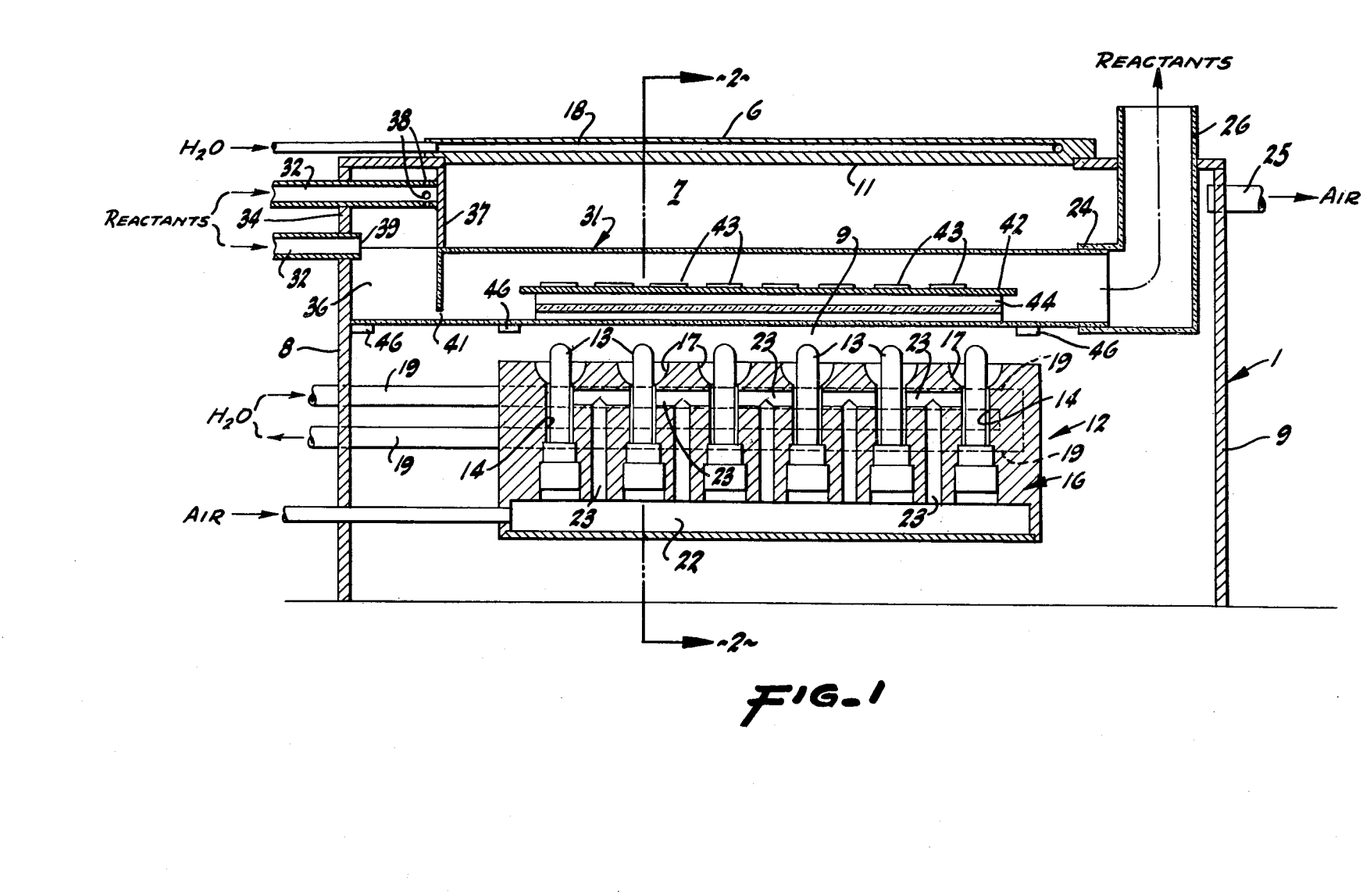
FIG. 1 is a longitudinal sectional view, largely schematic in nature, through one embodiment of the subject apparatus.
Figure 2:
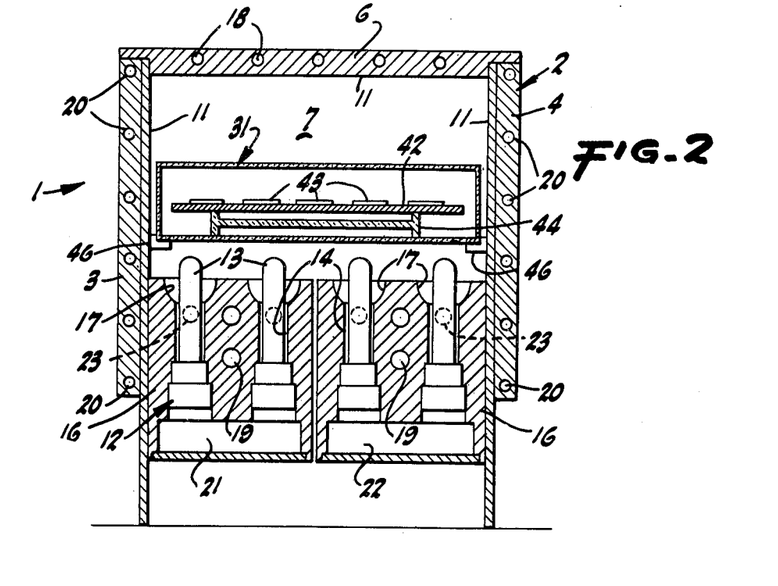
FIG. 2 is a vertical sectional view through the apparatus taken in the plane of line 2—2 of FIG. 1.

Referring first to the apparatus embodiment shown in FIGS. 1 and 2, it should be understood that the reactor structure is shown in generally schematic fashion and is intended to be enclosed within a surrounding enclosure (not shown) in and on which the necessary gaseous reactant flow controls, electrical power sources, and other attendant mechanisms are intended to be housed and mounted. For purposes of clarity of illustration, only those portions of the reactor necessary to illustrate the inventive concepts disclosed herein have been shown in the drawings. It will be understood that those portions of the reactor illustrated are intended to be supported within the aforementioned enclosure in any suitable fashion.

The radiation heated reactor of FIGS. 1 and 2, generally designated 1 comprises an elongated housing generally designated 2 defined as best seen in FIG. 2 by opposed sidewalls 3 and 4 and a removable top closure 6, the latter being slidable along or otherwise separable from the upper margin of the sidewalls 3 and 4 to permit access to the hollow interior 7 of the housing.

Opposite ends of the housing, designated 8 and 9, may be closed off in any suitable fashion, such as by employing end walls or the like so that the interior 7 of the housing is completely enclosed. However, access into the hollow interior through one end of the housing is necessary so that substrates to be coated can be loaded and unloaded therefrom prior to and following deposition coating thereof. Suitable access doors (not shown) may be provided in the end wall 9 of the housing and in the reaction chamber to be described so that such access may be had to the reaction chamber.

Preferably the inner surfaces 11 of each of the confining walls of the housing and of the top closure thereof are formed of a highly polished reflecting material, such as polished sheet aluminum. Such reflecting surfaces are provided to permit maximum utilization of the heat generated by the heat source to be described. These surfaces also direct energy radiated by the substrates back to the substrates, thereby minimizing heat loss and thermal gradients in the substrates.

The heat source is designated 12 and extends laterally across the housing as seen in FIG. 2 and is secured in position by fastening the same to suitable portions of the housing sidewalls. The heat source comprises at least one high intensity lamp capable of producing and transmitting radiant heat energy at a short wave length, preferably one which is approximately 1 micron or less.

In the embodiment illustrated, the heat source comprises a bank of such lamps, each designated 13, which are mounted in threaded sockets 14 in a pair of side by side lamp mounting blocks 16. The electrical connections for the lamps are not illustrated but such connection are conventional. The upper open end of each lamp socket 14 is formed as an enlarged semispherical recess 17 which is highly polished to serve as a reflecting surface for the purpose noted.

The lamps preferably employed with the present apparatus and those illustrated in the drawings are high intensity tungsten filament lamps having a transparent quartz envelope and a halogen gas contained therein, preferably iodine. Such lamps are manufactured by the Aerometrics Division of Aerojet-General Corporation. Similar lamps are produced by General Electric Corporation.

The lamp employed in the embodiment of FIGS. 1 and 2 is constructed to be mounted upright but in another embodiment to be described hereinafter another configuration may be utilized.

Because of the substantial temperatures at which such lamps operate, e.g., 5000°-6000° F., means are provided in conjunction with the housing and with the lamp mounting blocks to cool the housing walls and the areas surrounding the lamp sockets to prevent overheating of the apparatus. As noted best from FIG. 2, such cooling means for the walls includes a plurality of parallel cooling fluid conduits 20 through which water or a like cooling medium is circulated. Similar cooling conduits 18 are provided in the top closure of the housing. Such conduits may be operatively connected with a supply of cooling fluid and a disposal system therefor in known fashion.

Also, preferably, fluid cooling conduits 19 are provided between adjacent rows of the bank of high intensity lamps as seen best in FIG. 2. Such conduits 19 are similarly connected with the supply of the cooling medium employed and a disposal system therefor.

The cooling means also preferably includes air circulation means which in the embodiment shown comprises a pair of adjacent cooling air plenum chambers 21 and 22 extending through the lamp mounting blocks 16 adjacent the base thereof. Such plenum chambers are operatively connected directly with the sockets 14 in which the lamps are received as well as with other vertically and laterally extending channels 23 which similarly extend longitudinally of the lamp mounting blocks. Thus, cooling air is forced to circulate around the lamps and through the hollow interior 7 of the housing for subsequent discharge through an exhaust port 25 in communication with an exhaust system (not shown).

Positioned within the hollow interior of the housing is a dimensions thereof may vary according to particular production needs. However, defines the reaction zone of the present apparatus in which the epitaxial coatings are deposited on substrates positioned therein. Such reaction zone is generally designated 31 and comprises a reaction chamber defined by an elongated generally enclosed tubular structure selectively formed from a material which is transparent to the short wave length heat energy generated by the heat source 12 previously described. In its preferred form, such reaction chamber has its walls formed from quartz which is transparent to radiation energy in the one micron and below range. The tube is generally rectangular in cross-sectional construction and the dimensions However, one such tube having dimensions of 2 inches by 6 inches with the length being determined in accordance with production requirements may be employed.

As seen in FIG. 1, one end of the reaction tube is operatively connected at 24 with an exhaust hood 26 which in turn is connected with the aforementioned exhaust system so that spent reaction gases may be withdrawn from the reactor. At its opposite ends, the gaseous reactants to be employed in the coating procedure are introduced into the reaction chamber through means which, in the embodiment illustrated, comprises a pair of conduits 32 and 33 which pass through a portion 34 of the end wall 8 of the reactor and terminate within a mixing chamber 36 defined by a baffle plate 37 and the end wall portion 34. The gaseous reactants emanate from tube 32 through a series of openings 38 provided therein adjacent the baffle plate while the end 39 of the other tube 32 is open directly into the mixing chamber. Following thorough mixing of the various reactants in the mixing chamber, the same pass beneath the baffle plate through a slotted passageway 41 provided therebetween and the bottom wall of the reaction chamber as seen in FIG. 1. It should be understood, of course, that the particular means chosen for introducing the gaseous reactants into the reaction chamber may be varied to meet particular manufacturing and production requirements.

Supported within the reaction chamber in the preferred embodiment shown is an elongated slab-like susceptor 42 on which a series of silicon or like wafers 43 are supported in spaced relationship. The size of the susceptor is correlated to the size of the quartz reaction chamber and may vary to meet particular commercial needs. It should also be understood that in commercial reactors, more than one reactor station may be provided so that treatment of one batch of wafers in one reaction chamber may be progressing while another reaction chamber is being unloaded or loaded.

Preferably susceptor 42 is supported above the bottom wall of the reaction chamber and for that purpose a supporting stand of any suitable construction may be provided, such as the elongated H-shaped stand 44 illustrated in FIG. 2. Preferably such a stand is transparent to the radiant energy emitted by the heat source and as such may be formed of quartz. While it is a requirement that the susceptor material employed be opaque to the radiant energy emitted from the heat source, various materials may be employed in that regard. In the preferred embodiment, such susceptor preferably is produced from graphite which readily absorbs and conducts radiant heat energy at the short wave length noted. It is not a requirement that the susceptor be electrically or thermally conductive. However, by utilizing a thermally conductive susceptor, uniform heating of the wafers positioned thereon is insured.

In certain embodiments of this apparatus it is visualized that the wafers may be directly heated in the reaction chamber without a susceptor by supporting the wafers directly on the bottom wall of the chamber. However, such a procedure is less desirable but, because of the opaque nature of the wafers, such a procedure will produce acceptable results although utilization of a susceptor as noted is highly preferable.

The reaction chamber 31 may be supported in any suitable fashion within the housing. In the generally schematically embodiment shown, a series of projecting supports, designated 46, are positioned at intervals along the length of the reactor as best seen in FIG. 2 and the reaction chamber rests upon such supports. Such supports may be formed from quartz to prevent their interferring with effective heat transmission.

Figure 3:
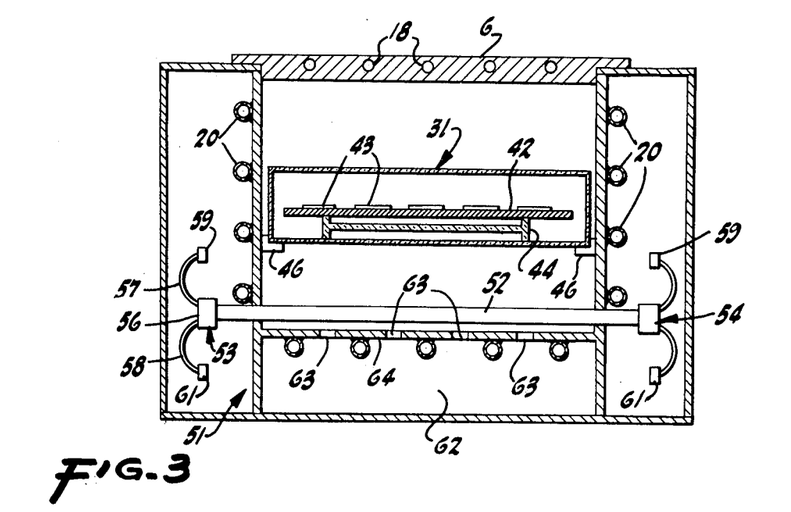
FIG. 3 is a vertical sectional view corresponding generally to FIG. 2 showing a modified embodiment of the subject apparatus.

The alternate embodiment shown in FIG. 3 is in all important respects the same as that described previously in FIGS. 1 and 2 with modifications being evident in conjunction with the heat source comprises at least one and preferably a bank of high intensity lamps 52 which generate radiant heat energy of the type described previously. However, the individual lamps 52 differ from those lamps 13 described previously in that each comprises an elongated tubular configuration which extends through opposite sidewalls thereof to be received within opposite spring mounting means 53 and 54 each defined by a socket 56 in which an end of the lamp is positioned. A pair of springs 57 and 58 are suitably anchored at 59 and 61 in brackets secured to a housing wall. The electrical connections for the lamps 52 have not been illustrated but such connections are of conventional construction.

It should be understood that a series of such lamps 52 are mounted as noted in generally parallel relationship and extend at spaced intervals across the housing a longitudinally spaced positions therealong. The inner surfaces 11 of the confining walls of the housing and the closure 6 are preferably fabricated of a highly polished reflecting material, such as polished sheet aluminum, for the purposes noted above.

Cooling water and cooling air means are provided for the purposes noted previously. The cooling water conduits 18 and 20 are arranged essentially the same as described previously with respect to FIG. 2. However, some modifications in the cooling air arrangement is necessitated because of the different construction of the lamps 52. In that regard, an enlarged plenum chamber 62 extends along the base of the housing and a series of air passages 63 extend through the bottom wall 64 of the housing defined by a polished metal plate so that cooling air may pass upwardly around the respective lamps and pass from the hollow interior of the housing into the exhaust system in the manner noted previously.

Lamps of the type shown at 52 are produced by General Electric as illustrated in their brochure No. TP-110 entitled "Incandescent Lamps" and marketed under the trademark "Quartzline".

Figure 4:
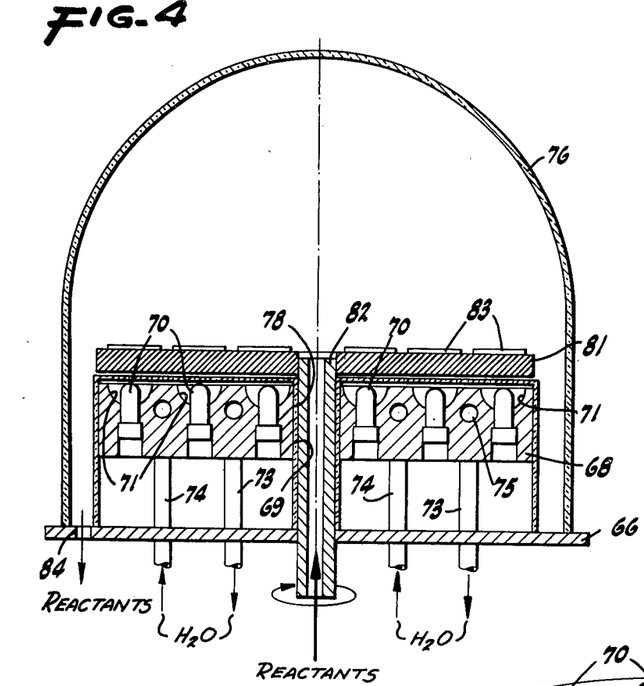
FIG. 4 is a vertical sectional view through another modified embodiment of the apparatus.
Figures 5, 6:
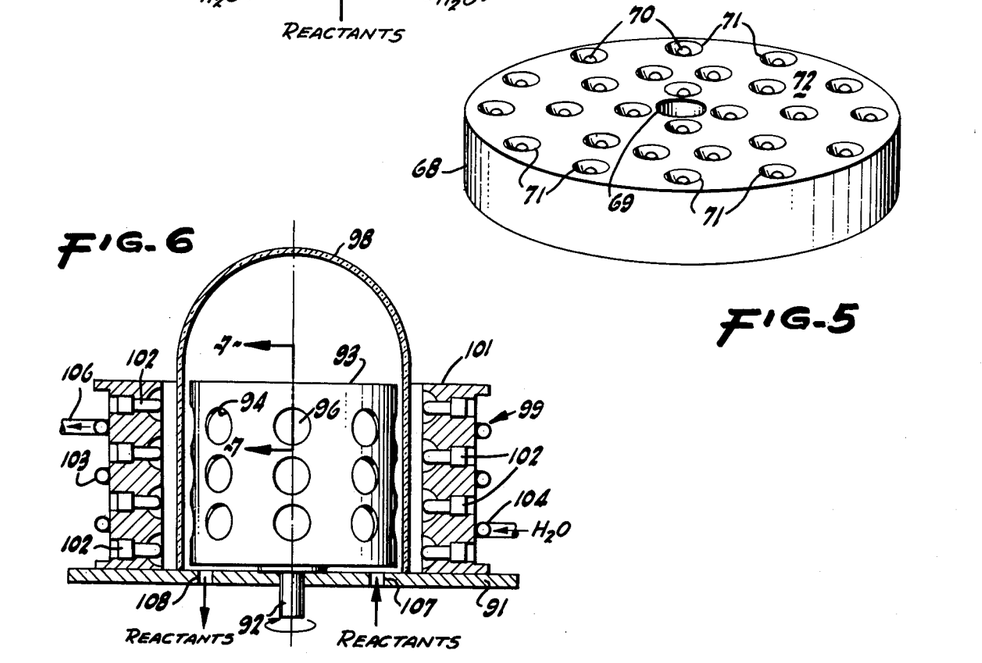
FIG. 5 is an isometric view of a portion of the apparatus of FIG. 4.
FIG. 6 is a vertical sectional view through a further modification of the apparatus.

FIGS. 4 and 5 illustrate a further modification of the subject radiation heated reactor in which the reactor construction is substantially different from that described previously but in which the epitaxial coating procedure corresponds to that described previously. As seen in FIG. 4, the reactor includes a support 66 to be positioned within and supported within a housing enclosure (not shown). The heat source, generally designated 67, in this embodiment comprises a cylindrical lamp mounting block 68 having a hollow interior 69 as best seen in FIG. 5. In the upper surface of the lamp mounting block are a series of semi-spherical recesses 71 in which high intensity lamps 70 of the type shown and described previously with respect to FIG. 1 are positioned.

The number of lamps 70 chosen depends upon the scope of the commercial operation intended for the reactor. It should be understood that suitable socket openings communicate with the semi-spherical recesses to accommodate the lamps therein in generally the same manner as shown in FIG. 1. The upper surface 72 of the lamp mounting block, as well as the surfaces of the socket recesses 71 are highly polished so as to be highly heat reflective. Similarly, the inner surface of the housing enclosure is preferably highly polished. The lamp mounting block is supported above the support plate 66 in any suitable fashion. In that regard, conduits 73 and 74 are spacedly secured to the base of the lamp mounting block and pass through the support plate 66 and are rigidly connected with the support plate so as to position the lamp mounting block above the support plate as noted in FIG. 4. The respective conduits 73 and 74 provide water cooling inlets and outlets which communicate with internal circulating channels 75 formed with the mounting block. Although not shown, if desired, air cooling means may be provided in conjunction with the respective lamp sockets also, in the fashion described herein previously.

The reaction chamber of this embodiment is defined by an outer bell jar 76 of conventional configuration and construction which rests upon the supporting plate 66 and completely encloses the heat source and the remaining reactor structure to be described. The inner portion of the reaction chamber is defined by a quartz shroud 77 which is hollow cylindrical in configuration, and donut shaped so that an inner portion 78 thereof fits within the bore 69 of the lamp mounting block as best seen in FIG. 4. Thus, the shroud completely separates the lamps and the lamp mounting block and associated structure from the hollow interior of the reaction chamber defined by the shroud and the surrounding bell jar.

This embodiment also uses an opaque susceptor of graphite or the like and such susceptor is in the form of a circular ring plate 81 secured in any suitable fashion to and supported by a hollow shaft 82 which projects upwardly through the support plate 66 of the reactor as seen in FIG. 4. Shaft 82 is rotatable at relatively slow speeds (e.g., 10 to 15 revolutions per minute) by means of any suitable gearing or motor drive (not shown) so that the susceptor and a supply of wafers 83 supported thereon are carried in a moving path above the heat source defined by the bank of lamps shown. The purpose of such movement relative to the heat source is to insure uniform heating of the susceptor and the wafers carried thereby. Access to the susceptor is had by lifting the bell jar.

The hollow shaft 82 further defines conduit means for introducing gaseous reactants into the reaction chamber for epitaxial reaction therein with the wafers 83. The spent reaction gases pass from the reaction chamber through a vent port 34 provided in the support plate 66 from which they pass into any suitable exhaust system (not shown).

Figure 7:
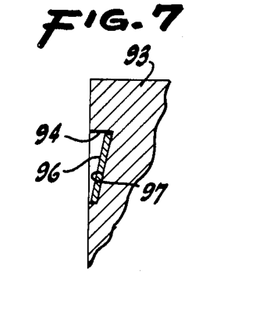
FIG. 7 is a sectional view taken in the plane of line 7—7 of FIG. 6.

A further embodiment of the subect radiation heated reactor, which has been found to be particularly suitable for producing single crystal coated wafers with little or no crystallographic slip, is illustrated in FIGS. 6 and 7. Such arrangement comprises a supporting plate 91 which is mounted within an enclosure (not shown) in any suitable manner. Projecting upwardly through the supporting plate 91 is a shaft 92 designed to be rotated by any suitable means (not shown).

Supported upon the upper end of shaft 92 is a generally cylindrical opaque susceptor of graphite or the like, designated 93. As seen in FIG. 7, the outer periphery of the susceptor is provided with a series of recesses 94 in which wafers to be epitaxially coated are positioned in generally vertical orientation. The inner wall 97 (FIG. 7) of each recess is inwardly inclined away from the vertical to insure retention of a wafer therein during rotation of the susceptor. In that regard, relatively slow rotation in the range of approximately 10 to 15 revolutions per minute is utilized. Rotation of the susceptor is provided to insure uniform heating of the susceptor by the heat source.

With this embodiment, the reaction chamber is defined by a quartz bell jar 98 of conventional construction and configuration which surrounds the susceptor and rests on the supporting plate 91 as seen in FIG. 4. Access to the susceptor is had by raising the bell jar.

The heat source, generally designated 99, employed in this embodiment comprises a cylindrical ring-shaped lamp mounting block 101 in which a series of high intensity lamps 102 are positioned in vertically spaced rows in the manner shown. The semi-spherical sockets from which the lamps project and inner periphery of the lamp block 101 are highly polished for the purpose noted previously.

Thus, the illustrated lamp bank surrounds the susceptor and is operatively separated therefrom by the reaction chamber defined by the bell jar 98. The lamp block 101 is provided with means for cooling the same in the form of a helical coil 103 which surrounds the same through which a cooling fluid such as water may enter at one end 104 thereof and exit at the other end 106 thereof. Cooling air also may be introduced through the lamp mounting block if desired.

The gaseous reactants are introduced through a suitable port structure 107 provided in plate 91 and the spent reaction gases exit from the reaction chamber through a port structure 108 for passage into a suitable exhaust system.

Figure 8:
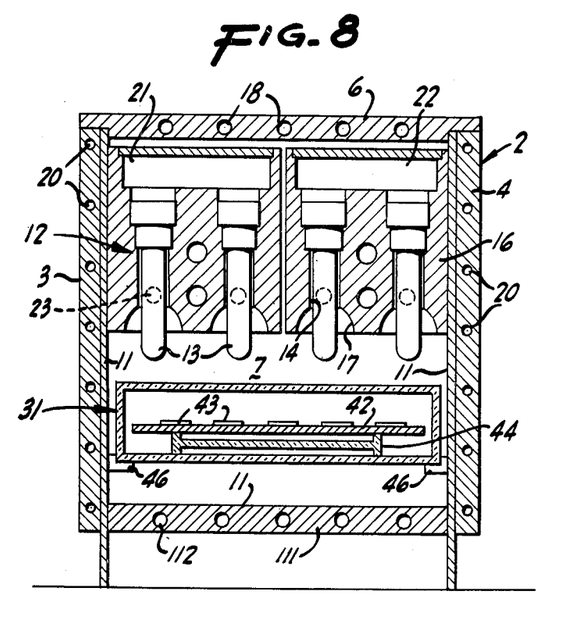
FIG. 8 is a vertical sectional view of another embodiment of the apparatus.

FIG. 8 illustrtes another embodiment of the radiation heated reactor which is particularly suitable for producing single crystal coated wafers with little or no crystallographic slip. This embodiment is generally similar to that shown in FIGS. 1 and 2 except that the heat source 12 is positioned above the reaction chamber 31. The substrates 43 are supported by the opaque susceptor 42 which rests on the stand 44, as described above with regard to FIGS. 1 and 2.

The heat source 12 is inverted in this embodiment, with the lamps 13 and the reflecting semi-spherical recesses 14 facing down toward the reaction chamber. The lamps ae preferably of the high intensity tungsten filament type discussed above with regard to FIGS. 1 and 2.

The housing of the embodiment of FIG. 8 includes a bottom wall 111 which preferably has a highly polished inner reflecting surface 11. This surface cooperates with the reflecting surfaces 11 of the other walls of the housing to permit maximum utilization of the heat generated by the source 12 and to minimize heat loss and thermal gradients in the substrates. The bottom wall 111 is provided with cooling conduits 112 through which water or a like cooking medium is circulated.

Figure 9:
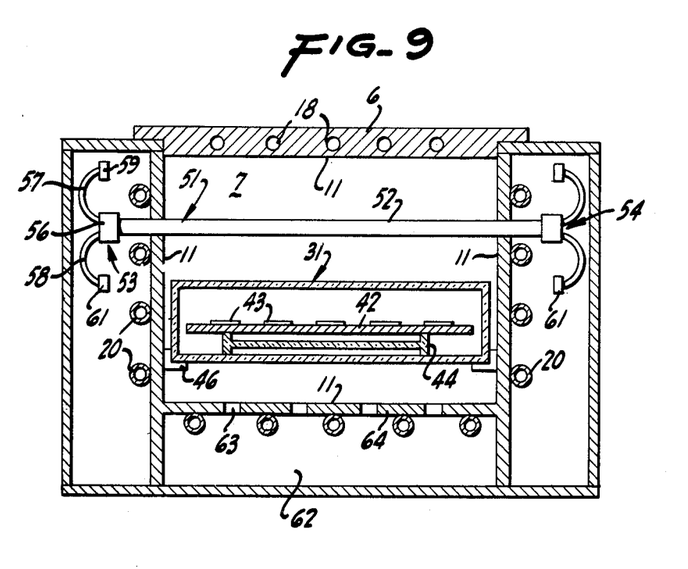
FIG. 9 is a vertical sectional view of a further embodiment of the apparatus.

FIG. 9 illustrates another embodiment of the apparatus which is also particularly suitable for producing single crystal coated wafers with little or no crystallographic slip. This embodiment is generally similar to that shown in FIG. 3 except that the heat source 51 is positioned above the reaction chamber 31. As in the embodiment of FIG. 3, the inner surface 11 of each of the walls of the housing and the closure 6 are preferably fabricated of a highly polished reflective material such as polished aluminum.

As mentioned previously, coated semiconductor wafers manufactured by the process and apparatus of FIGS. 6–9 have been found to be substantially free of crystallographic slip. With direct energy transfer from the radiant heat source to the wafer, the wafer and supporting susceptor member heat at approximately the same rate. During the period when the wafers are at a temperature at which they can deform plastically, there is a close balance on the exposed surface of the wafers between heat loss due to the gas reactants and heat gain due to energy from the heat source. Both the wafers and the susceptor are heated uniformly to substantially the same temperature throughout, and there is little or no crystal slip in either the substrate wafer or the epitaxial film deposited thereon. The process and apparatus can be used equally well for heating substrates in connection with diffusion and other techniques commonly utilized in manufacturing semiconductors.

Having thus made a full disclosure of various embodiments of improved apparatus and process for epitaxially coating substrates, reference is directed to the appended claims for the scope of protection to be afforded thereto.

We claim:

1. A method for heating a plurality of substrate members formed of a single crystal material with substantially no crystallographic slip in a process for the formation of semiconductor regions by epitaxial growth, said method comprising the steps of:

placing the substrate members in intimate contact with a susceptor body on one side of the same in a cool wall reaction chamber, heating the substrate members and the susceptor body directly and simultaneously in an unfocused, substantially uniform field of radiant heat energy produced by a bank of high intensity radiant heat lamps located on the same side of the susceptor body as the substrate members, whereby the substrate members are heated uniformly and without appreciable thermal gradiants by a combination of direct radiation from the heat lamps and heat transfer from the susceptor body, and introducing a gaseous reactant into the reaction chamber to effect deposition of a chemical vapor coating on the substrate members.

2. The method of claim 1 in which the energy from the heat lamps has a wave length on the order of one micron.

3. The method of claim 1 further including the step of moving the substrate members and susceptor body relative to the heat lamps.

4. The method of claim 1 wherein the chamber wall is maintained at a lower temperature than the heat lamps, susceptor body and substrate members.

* * * * *

UNITED STATES PATENT OFFICE
CERTIFICATE OF CORRECTION

Patent No. 4,081,313          Dated  March 28, 1978

Inventor(s) Michael A. McNeilly et al.

It is certified that error appears in the above-identified patent and that said Letters Patent are hereby corrected as shown below:

Colume 1, line 68, "of" should be "or".

Column 3, line 13, "system" should be "systems".

Colume 3, line 17, "reation" should be "reaction".

Colume 4, line 30, "shortwave" should be "short wave".

Column 4, line 34, "direct" should be "directed".

Column 5, line 19, "Gallium" should be "gallium".

Column 5, line 29, "4HCL 4HCL" should be "4HCL".

Column 5, line 35, "$4MH_3$" should be "$4NH_3$".

Column 5, line 37, "$4MH_3$" should be "$4NH_3$".

Column 6, line 61-62, "connection" should be "connections".

Column 7, lines 41-42, "dimensions thereof may vary according to particular production needs.  However," should be "structure which".

UNITED STATES PATENT OFFICE
CERTIFICATE OF CORRECTION

Patent No. 4,081,313　　　　　　　Dated March 28, 1978

Inventor(s) Michael A. McNeilly et al.

It is certified that error appears in the above-identified patent and that said Letters Patent are hereby corrected as shown below:

In Figure 4, reference numeral 77 should be applied to shroud 77 as follows:

UNITED STATES PATENT OFFICE
CERTIFICATE OF CORRECTION

Patent No. 4,081,313            Dated   March 28, 1978

Inventor(s) Michael A. McNeilly et al.

It is certified that error appears in the above-identified patent and that said Letters Patent are hereby corrected as shown below:

Column 7, line 55 should read "sectional construction and the dimensions thereof may vary according to particular production needs. However,".

Column 9, line 10, "housing a" should be "housing at".

Column 10, line 38, "subect" should be "subject".

Colume 10, line 63, "FIG. 4" should "FIG. 6".

Column 11, line 19, "illustrtes" should be "illustrates".

Column 11, line 31, "ae" should be "are".

Column 11, line 42, "cooking" should be "cooling".

Column 12, line 39, "qradiants" should be "gradients".

Signed and Sealed this

Twenty-sixth Day of December 1978

[SEAL]

Attest:

RUTH C. MASON
Attesting Officer

DONALD W. BANNER
Commissioner of Patents and Trademarks

UNITED STATES PATENT AND TRADEMARK OFFICE

Certificate

Patent No. 4,081,313

Patented: March 28, 1978

On petition requesting issuance of a certificate for correction of inventorship pursuant to 35 U.S.C. §256, it has been found that the above identified patent, through error and without any deceptive intent, improperly sets forth the inventorship.

Accordingly, it is hereby certified that the correct inventorship of this patent is *Michael A. McNeilly, Walter C. Benzing.*

Signed and Sealed this Eleventh Day of February 1992

BRIAN E. HEARN

*Supervisory Patent Examiner*
*Art Unit 1100*